US007313017B2

(12) United States Patent
Ooishi et al.

(10) Patent No.: US 7,313,017 B2
(45) Date of Patent: Dec. 25, 2007

(54) THIN FILM MAGNETIC MEMORY DEVICE CONDUCTING READ OPERATION BY A SELF-REFERENCE METHOD

(75) Inventors: Tsukasa Ooishi, Hyogo (JP); Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 123 days.

(21) Appl. No.: 11/374,063

(22) Filed: Mar. 14, 2006

(65) Prior Publication Data

US 2006/0152972 A1 Jul. 13, 2006

Related U.S. Application Data

(62) Division of application No. 11/045,100, filed on Jan. 31, 2005, now Pat. No. 7,057,925, which is a division of application No. 10/323,916, filed on Dec. 20, 2002, now Pat. No. 6,856,565.

(30) Foreign Application Priority Data

Jun. 21, 2002 (JP) ............................ 2002-181364

(51) Int. Cl.
*G11C 11/14* (2006.01)

(52) U.S. Cl. ....................... 365/171; 365/158; 365/207

(58) Field of Classification Search ................ 365/158, 365/171, 207
See application file for complete search history.

(56) References Cited

U.S. PATENT DOCUMENTS 6,055,178 A 4/2000 Naji
6,185,143 B1 * 2/2001 Perner et al. ............... 365/210

(Continued)

FOREIGN PATENT DOCUMENTS

DE 199 47 118 C1 3/2001

(Continued)

OTHER PUBLICATIONS

Roy Scheuerlein et al., "A 10ns Read and Write Non-Volatile Memory Array using a Magnetic Tunnel Junction and FET Switch in Each Cell", ISSCC Digest of Technical Papers, TA7.2, Feb. 2000, pp. 94-95, 128-129, 409-410.

(Continued)

*Primary Examiner*—Hoai V. Ho
(74) *Attorney, Agent, or Firm*—McDermott Will & Emery LLP

(57) ABSTRACT

In read operation, a current from a current supply transistor flows through a selected memory cell and a data line. Moreover, a bias magnetic field having such a level that does not destroy storage data is applied to the selected memory cell. By application of the bias magnetic field, an electric resistance of the selected memory cell changes in the positive or negative direction depending on the storage data level. A sense amplifier amplifies the difference between voltages on the data line before and after the change in electric resistance of the selected memory cell. Data is thus read from the selected memory cell by merely accessing the selected memory cell. Moreover, since the data line and the sense amplifier are insulated from each other by a capacitor, the sense amplifier can be operated in an optimal input voltage range regardless of magnetization characteristics of the memory cells.

3 Claims, 11 Drawing Sheets

U.S. PATENT DOCUMENTS

| | | | |
|---|---|---|---|
| 6,205,075 | B1 | 3/2001 | Nomura |
| 6,317,376 | B1 | 11/2001 | Tran et al. |
| 6,501,679 | B2 | 12/2002 | Hidaka |
| 6,597,601 | B2 | 7/2003 | Ooishi |

FOREIGN PATENT DOCUMENTS

| | | | |
|---|---|---|---|
| DE | 100 36 140 | C1 | 12/2001 |
| DE | 101 19 499 | A1 | 4/2002 |
| DE | 100 59 182 | A1 | 6/2002 |
| DE | 102 44 969 | A1 | 7/2003 |
| DE | 103 03 702 | A1 | 12/2003 |

OTHER PUBLICATIONS

M. Durlam et al., “Nonvolatile RAM based on Magnetic Tunnel Junction Elements”, ISSCC Digest of Technical Papers, TA7.3, Feb. 2000, pp. 96-97, 130-131, 410-411.

Wang, Z., et al. “Spin Tunneling Random Access Memory (STram)” IEEE Transactions on Magnetics, Sep. 1996, vol. 32, No. 5, pp. 4022-4024.

* cited by examiner

WE(AMPLITUDE OF Vcc2)
RS(AMPLITUDE OF Vcc2)
Rd(j)(AMPLITUDE OF Vcc2)
Vcc1
165
N11
161
162
/Ng
164
163
160
155
156
157
N10
Vss
Vcc2
172
N12
170
174
Vss
150
Ng
85
86
150
150
WE,RS,Rd(j+1)
WE,RS,Rd(j+2)
VPL
WDL
GPL
Vcc1
ACT
88
Vss

Vcc1
88
/ACT
VPL
WDL
Vss
85
87
/Ng
150
WE,RS,Rd(j+1)
WE,RS,Rd(j+2)
Ng
161
163
N13
N12
172
170
174
Vcc2
164
N11
162
160
165
N10
157
155
156
N14
175
176
178
RS
WE (AMPLITUDE OF Vcc2)
RS (AMPLITUDE OF Vcc2)
Rd(j) (AMPLITUDE OF Vcc2)

THIN FILM MAGNETIC MEMORY DEVICE CONDUCTING READ OPERATION BY A SELF-REFERENCE METHOD

RELATED APPLICATIONS

This application is a divisional of application Ser. No. 11/045,100, filed Jan. 31, 2005, now issued as U.S. Pat. No. 7,057,925 which is a divisional of application Ser. No. 10/323,916, filed Dec. 20, 2002, now U.S. Pat. No. 6,856,565, which claims priority of Japanese Application No. 2002-181364, filed Jun. 21, 2002, the contents of which are hereby incorporated by reference.

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 11 schematically shows the structure of a memory cell having a magnetic tunnel junction (hereinafter, sometimes simply referred to as "MTJ memory cell").

Referring to FIG. 11, the MTJ memory cell includes a tunneling magneto-resistance element TMR having an electric resistance varying according to a magnetically written storage data level, and an access element ATR. Access transistor ATR is connected in series with tunneling magneto-resistance element TMR between a write bit line WBL and a read bit line RBL. Typically, a field effect transistor formed on a semiconductor substrate is used as access transistor ATR.

A write bit line WBL, a write digit line WDL, a word line WL and a read bit line RBL are provided for the MTJ memory cell. Write bit line WBL and write digit line WDL allow data write currents of different directions to flow therethrough in write operation, respectively. Word line WL is used to conduct read operation. Read bit line RBL receives a data read current. In read operation, tunneling magneto-resistance element TMR is electrically coupled between write bit line WBL having a ground voltage GND and read bit line RBL in response to turning-ON of access transistor ATR.

FIG. 12 is a conceptual diagram illustrating write operation to the MTJ memory cell.

Referring to FIG. 12, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction corresponding to an external magnetic field (hereinafter, sometimes simply referred to as "free magnetic layer"). A tunneling barrier (tunneling film) TB is interposed between fixed magnetic layer FL and free magnetic layer VL. Tunneling barrier TB is formed from an insulator film. Free magnetic layer VL is magnetized either in the same direction as or in the opposite (antiparallel) direction to that of fixed magnetic layer FL according to a write data level. Fixed magnetic layer FL, tunneling barrier TB and free magnetic layer VL form a magnetic tunnel junction.

The electric resistance of tunneling magneto-resistance element TMR varies according to the relation between the respective magnetization directions of fixed magnetic layer FL and free magnetic layer VL. More specifically, the electric resistance of tunneling magneto-resistance element TMR has a minimum value Rmin when fixed magnetic layer FL and free magnetic layer VL have parallel magnetization directions, and has a maximum value Rmax when they have opposite (antiparallel) magnetization directions.

In write operation, word line WL is inactivated and access transistor ATR is turned OFF. In this state, a data write current for magnetizing free magnetic layer VL is applied to each of write bit line WBL and write digit line WDL in a direction corresponding to the write data level.

FIG. 13 is a conceptual diagram showing the relation between the data write current and the magnetization direction of the tunneling magneto-resistance element in write operation.

Referring to FIG. 13, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic fields H(EA), H(HA) respectively correspond to two magnetic fields produced by the currents flowing through write bit line WBL and write digit line WDL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing 1-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line shown in the figure. In other words, the magnetization direction of free magnetic layer VL does not switch if the strength of an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to change the magnetization direction along the easy axis.

When the operation point of write operation is designed as in the example of FIG. 13, a data write magnetic field of the easy-axis direction is designed to have a strength $H_{WR}$ in the MTJ memory cell to be written. In other words, a data write current to be applied to write bit line WBL or write digit line WDL is designed to produce the data write magnetic field $H_{WR}$. In general, data write magnetic field $H_{WR}$ is given by the sum of a switching magnetic field $H_{SW}$ required to switch the magnetization direction and a margin $\Delta H$. Data write magnetic field $H_{WR}$ is thus given by $H_{WR}=H_{SW}+\Delta H$.

In order to rewrite the storage data of the MTJ memory cell, that is, the magnetization direction of tunneling magneto-resistance element TMR, a data write current of at least a prescribed level must be applied to both write digit line WDL and write bit line WBL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR i.e., the storage data of the MTJ memory cell, is held in a non-volatile manner until another data write operation is conducted.

FIG. 14 is a conceptual diagram illustrating read operation from the MTJ memory cell.

Referring to FIG. 14, in read operation, access transistor ATR is turned ON in response to activation of word line WL. Write bit line WBL is set to ground voltage GND. As a result, tunneling magneto-resistance element TMR is pulled down to ground voltage GND and electrically coupled to read bit line RBL.

If read bit line RBL is then pulled up to a prescribed voltage, a memory cell current Icell corresponding to the electric resistance of tunneling magneto-resistance element TMR, that is, the storage data level of the MTJ memory cell, flows through a current path including read bit line RBL and tunneling magneto-resistance element TMR. For example, the storage data can be read from the MTJ memory cell based by comparing memory cell current Icell with a prescribed reference current.

The electric resistance of tunneling magneto-resistance element TMR thus varies according to the magnetization direction that is rewritable by an applied data write magnetic field. Accordingly, non-volatile data storage can be realized by using electric resistances Rmax, Rmin of tunneling magneto-resistance element TMR as the storage data levels ("1"and "0"). The MRAM device thus stores data by using the difference between junction resistances ($\Delta R$=Rmax−Rmin) that corresponds to the difference in storage data level in tunneling magneto-resistance element TMR.

In general, the MRAM device includes reference cells for producing a reference current to be compared with a memory cell current Icell, in addition to the normal MTJ memory cells for storing data. The reference cells must be designed to produce a reference current that is equal to an intermediate value of the two memory cell currents Icell respectively corresponding to the two electric resistances Rmax, Rmin of the MTJ memory cell. Basically, these reference cells are also designed to have the same tunneling magneto-resistance element TMR as that of the normal MTJ memory cells.

A current passing through tunneling magneto-resistance element TMR is significantly affected by the thickness of an insulating film used as a tunneling film. Accordingly, if the normal MTJ memory cell and the reference cell have any difference in thickness of the tunneling film, the reference current cannot be set to a desired level. For this reason, it is difficult to accurately set the reference current produced by the reference cell to a level that allows the above small current difference to be sensed. Accordingly, accuracy of read operation may be reduced by variation in reference current.

In particular, in a common MTJ memory cell, the resistance difference $\Delta R$ produced according to the storage data level is not so large. Typically, electric resistance Rmin is at most about several tens of percents of Rmax. Memory cell current Icell therefore varies at most on the order of microamperes ($\mu$A: $10^{-6}$ A) according to the storage data level. Accordingly, the respective tunneling films of the normal MTJ memory cell and the reference cell must be formed with an accurate thickness.

However, such a strict manufacturing process regarding accuracy of the thickness of the tunneling film may reduce the manufacturing yield and the like, thereby possibly increasing the manufacturing costs. Accordingly, there is a demand for the MRAM device capable of accurately conducting read operation based on the resistance difference $\Delta R$ in the MTJ memory cell without requiring a strict manufacturing process.

In order to solve the above problems, U.S. Pat. No. 6,317,376 B1 discloses the structure of an MRAM device for conducting read operation by a so-called "self-reference method". More specifically, this MRAM device conducts read operation by merely accessing a selected memory cell without using any reference cell.

According to the conventional self-reference read operation disclosed in the above U.S. Pat. No. 6,317,376 B1, each read operation is formed by the following five operations which are conducted successively: (1) reading storage data from a selected memory cell; (2) reading data after forcibly writing data "0" to the selected memory cell; (3) reading data after forcibly writing data "1" to the selected memory cell; (4) producing read data based on the read operation results of (1) to (3); and (5) rewriting (restoring) the read data to the selected memory cell. In such read operation, data can be read by merely accessing the selected memory cell. As a result, read operation can be conducted with high accuracy regardless of manufacturing variation of reference cells.

In the conventional self-reference read operation, however, forcible write and read operations must be repeatedly conducted in each read operation. Moreover, since the storage data of the selected memory cell is destroyed, rewrite operation is required in each read operation. This hinders implementation of an improved read operation speed.

SUMMARY OF THE INVENTION

It is an object of the present invention to provide the structure of a thin film magnetic memory device for conducting high-speed, accurate read operation based on a self-reference method.

In summary, according to one aspect of the present invention, a thin film magnetic memory device includes a plurality of memory cells, a data line, a current supply circuit, a bias magnetic field applying section, and a data read circuit. Each of the plurality of memory cells is magnetized along an easy axis in a direction corresponding to storage data magnetically written therein, and has an electric resistance corresponding to a magnetization direction. The data line is electrically coupled to a fixed voltage through a selected one of the plurality of memory cells in read operation. The current supply circuit couples the data line to a first prescribed voltage at least in the read operation. The bias magnetic field applying section applies a bias magnetic field along a hard axis to the selected memory cell. The data read circuit produces read data corresponding to storage data of the selected memory cell, based on voltages on the data line before and after application of the bias magnetic field to the selected memory cell in the read operation. The data read circuit includes a coupling capacitor, a voltage transmitting section, a voltage holding section, a first voltage amplifier, and a data producing circuit. The coupling capacitor is provided between a first sense input node and the data line, and transmits a voltage change on the data line before and after application of the bias magnetic field to the first sense input node. The voltage transmitting section sets a voltage of a second sense input node to a same level as that of the first sense input node before application of the bias magnetic field in the read operation. The voltage holding section holds the voltage of the second sense input node. The first voltage amplifier amplifies a voltage difference between the first and second sense input nodes. The data producing circuit produces the read data according to an output of the first voltage amplifier after application of the bias magnetic field in the read operation.

Preferably, the voltage transmitting section includes a first switch provided between a second prescribed voltage independent of the first prescribed voltage and the first sense input node, and a second switch provided between the second sense input node and an output node of the first voltage amplifier. In the read operation, each of the first and second switches is turned ON before application of the bias magnetic field and turned OFF after application of the bias magnetic field.

Therefore, a main advantage of the present invention is as follows: when a bias magnetic field along the hard axis direction is applied to a selected memory cell, the electric resistance of the selected memory cell changes in the positive or negative direction (rises or falls) depending on the storage data level. By using such a property, self-reference read operation can be conducted at a high speed by merely accessing the selected memory cell. In other word, forcible write and read operations and rewrite operation of the storage data to the selected memory cell are not required.

Moreover, a precharge voltage of the data line (first prescribed voltage) and a precharge voltage of the first and second sense input nodes in the balanced state before application of the bias magnetic field (second prescribed voltage) can be independently set to optimal values. Accordingly, the precharge voltage of the data line is set to an optimal level in view of MR (Magneto-Resistive) characteristics in the memory cell, whereas the precharge voltage of the first and second sense amplifiers can be set to such a level that assures an operation margin of the sense amplifier.

According to another aspect of the present invention, a thin film magnetic memory device includes a plurality of memory cells, a data line, a current supply circuit, a bias magnetic field applying section, and a data read circuit. Each of the plurality of memory cells is magnetized along an easy axis in a direction corresponding to storage data magnetically written therein, and has an electric resistance corresponding to a magnetization direction. The data line is electrically coupled to a fixed voltage through a selected one of the plurality of memory cells in read operation. The current supply circuit couples the data line to a prescribed voltage at least in the read operation. The bias magnetic field applying section applies a bias magnetic field along a hard axis to the selected memory cell in the read operation, and applies a data write magnetic field along the hard axis to a selected memory cell in the write operation. The bias magnetic field applying section includes a plurality of current lines, a plurality of driver transistors, and a plurality of current line drive control sections. The plurality of current lines are each provided for every prescribed block of the plurality of memory cells, and each selectively receives a current for applying a magnetic field of a direction along the hard axis to each of corresponding memory cells. The plurality of driver transistors are provided corresponding to the plurality of current lines and each is connected in series with corresponding one of the plurality of current lines between first and second voltages. Each of the current line drive control sections controls ON/OFF of corresponding one of the driver transistors. The plurality of current line drive control sections are provided corresponding to the plurality of current lines and each includes a control circuit for controlling a driver current of corresponding one of the plurality of driver transistors according to address information indicating whether the corresponding current line corresponds to the selected memory cell or not. The control circuit causes the driver current to change more slowly in the read operation than in the write operation. The data read circuit produces read data corresponding to storage data of the selected memory cell, based on voltages on the data line before and after application of the bias magnetic field to the selected memory cell in the read operation.

When a bias magnetic field along the hard axis direction is applied to a selected memory cell, the electric resistance of the selected memory cell changes in the positive or negative direction (rises or falls) depending on the storage data level. By using such a property, the above thin film magnetic memory device can conduct self-reference read operation at a high speed by merely accessing the selected memory cell. In other word, forcible write and read operations and rewrite operation of the storage data to the selected memory cell are not required. Moreover, since the structure for generating a bias magnetic field can also be used to generate a prescribed data write magnetic field in write operation, the circuit structure can be simplified. Especially, since a bias magnetic field is gradually generated in read operation, abrupt change in data line voltage is prevented, whereby stable read operation with reduced noises can be implemented.

According to still another aspect of the present invention, a thin film magnetic memory device includes a plurality of memory cells, a data line, a current supply circuit, a magnetic field applying section, and a data read circuit. Each of the plurality of memory cells is magnetized along an easy axis in a direction corresponding to storage data magnetically written therein, and has an electric resistance corresponding to a magnetization direction. The data line is electrically coupled to a fixed voltage through a selected one of the plurality of memory cells in read operation. The current supply circuit couples the data line to a prescribed voltage at least in the read operation. The magnetic field applying section receives a first power supply voltage and applies a predetermined magnetic field along a hard axis to the selected memory cell in each of write operation and read operation. The data read circuit receives a second power supply voltage and the fixed voltage, and produces read data corresponding to storage data of the selected memory cell. A difference between the first power supply voltage and the fixed voltage is larger than a difference between the second power supply voltage and the fixed voltage.

When a bias magnetic field along the hard axis direction is applied to a selected memory cell, the electric resistance of the selected memory cell changes in the positive or negative direction (rises or falls) depending on the storage data level. By using such a property, the above thin film magnetic memory device can conduct self-reference read operation at a high speed by merely accessing the selected memory cell. In other word, forcible write and read operations and rewrite operation of the storage data to the selected memory cell are not required. Moreover, since the structure for generating a bias magnetic field can also be used to generate a prescribed data write magnetic field in write operation, the circuit structure can be simplified. Especially, since a current line can be driven with a sufficient voltage difference, a sufficient amount of current can be supplied to generate a bias magnetic field and a data write magnetic field.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the accompanying drawings.

First Embodiment

Figure 1:
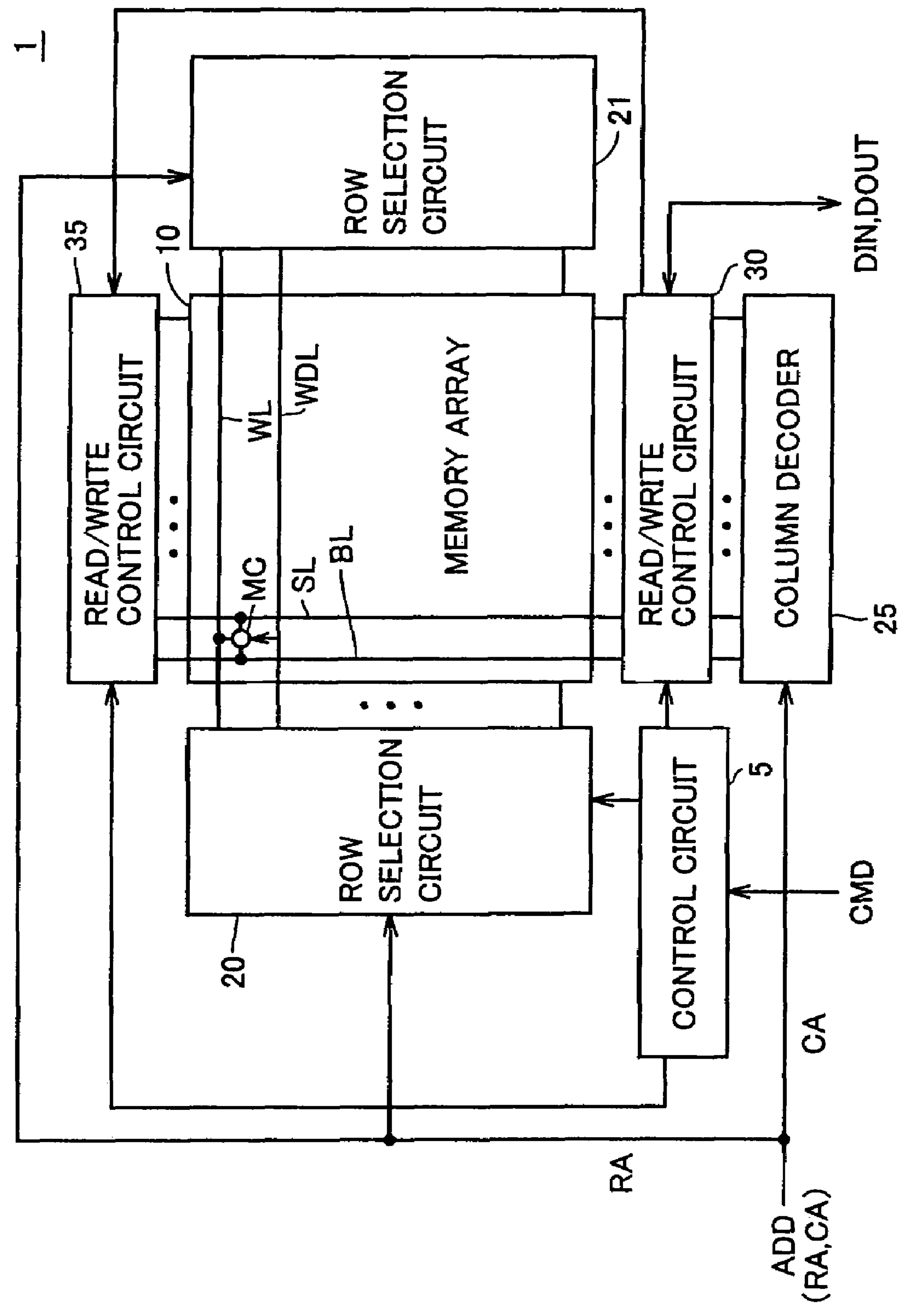
FIG. 1 is a schematic block diagram showing the overall structure of an MRAM device according to an embodiment of the present invention.

Referring to FIG. 1, an MRAM device 1 according to an embodiment of the present invention conducts random access in response to an external control signal CMD and an external address signal ADD to write input data DIN to, or read output data DOUT from, a memory cell selected for write or read operation (hereinafter, sometimes referred to as "selected memory cell").

MRAM device 1 includes a control circuit 5 for controlling the overall operation of MRAM device 1 in response to control signal CMD, and a memory array 10 having MTJ memory cells MC arranged in a matrix. The structure of each MTJ memory cell and the principles of data storage of each MTJ memory cell are the same as those described in FIGS. 11 to 14.

In memory array 10, word lines WL and write digit lines WDL are provided corresponding to the MTJ memory cell rows, and bit lines BL and source lines SL are provided corresponding to the MTJ memory cell columns. FIG. 1 exemplarily shows a single MTJ memory cell MC, and a corresponding word line WL, write digit line WDL, bit line BL and source line SL.

MRAM device 1 further includes row selection circuits 20, 21 for selecting a row in memory array 10 according to a row address RA indicated by address signal ADD, a column decoder 25 for selecting a column in memory array 10 according to a column address CA indicated by address signal ADD, and read/write control circuits 30, 35.

Read/write control circuits 30, 35 each collectively refers to a circuit group for conducting read operation and write operation from and to an MTJ memory cell MC in memory array 10.

Hereinafter, binary voltage states of a signal, signal line, data and the like, that is, a high-voltage state (e.g., power supply voltage Vcc1, Vcc2) and a low-voltage state (e.g., ground voltage GND), are sometimes referred to as "H level" and "L level", respectively.

As can be seen from the following description, in the present invention, the operation speed of self-reference read operation is improved by applying a bias magnetic field to a selected memory cell. First, the principles of read operation of the present invention will be described.

Figure 2:
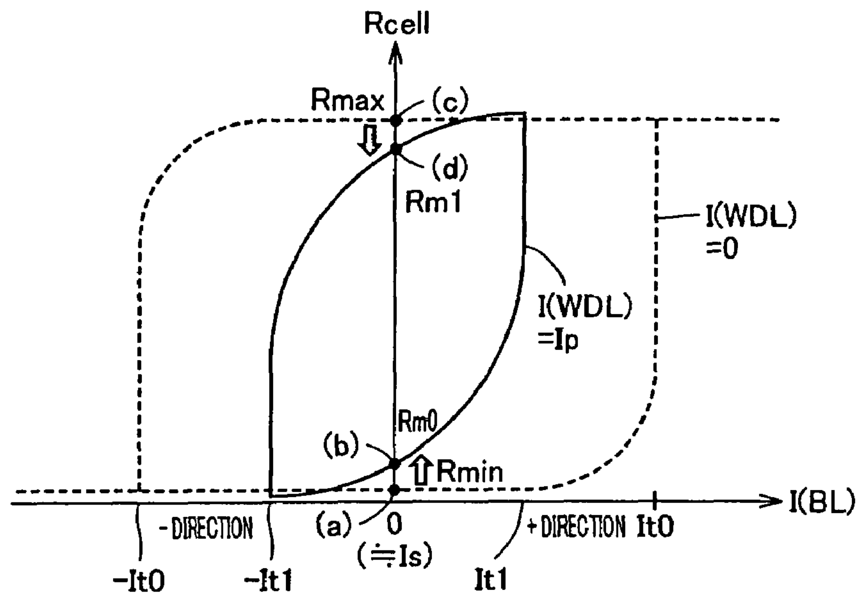
FIG. 2 is a conceptual diagram illustrating principles of read operation according to an embodiment of the present invention.

FIG. 2 is a conceptual diagram showing the relation between a current for applying a magnetic field to the MTJ memory cell and an electric resistance of the MTJ memory cell (hysteresis characteristics).

Referring to FIG. 2, the abscissa indicates a bit line current I(BL) flowing through a bit line, and the ordinate indicates an electric resistance Rcell of the MTJ memory cell. A magnetic field produced by bit line current I(BL) has a direction along the easy-axis (EA) in free magnetic layer VL of FIG. 11. On the other hand, a magnetic field produced by a digit line current I(WDL) flowing through a write digit line WDL has a direction along the hard-axis (HA) in free magnetic layer VL.

Accordingly, when bit line current I(BL) exceeds a threshold value for inverting the magnetization direction of free magnetic layer VL, the magnetization direction of free magnetic layer VL is inverted, and memory cell resistance Rcell varies. In FIG. 2, memory cell resistance Rcell has a maximum value Rmax when bit line current I(BL) of the positive direction exceeds the threshold value. Memory cell resistance Rcell has a minimum value Rmin when bit line current I(BL) of the negative direction exceeds the threshold value. The threshold value of bit line current I(BL) varies depending on digit line current I(WDL) flowing through write digit line WDL.

When digit line current I(WDL) flowing through write digit line WDL is zero, memory cell resistance Rcell has hysteresis characteristics shown by dashed line in FIG. 2. The threshold values of bit line current I(BL) in the positive and negative directions are herein denoted with It0 and –It0, respectively.

On the other hand, when digit line current I(WDL) is applied to write digit line WDL, the threshold values of bit line current I(BL) are reduced. When digit line current I(WDL) is Ip, memory cell resistance Rcell has hysteresis characteristics shown by solid line in FIG. 2. Due to the magnetic field of the hard-axis direction produced by digit line current I(WDL), the threshold values of bit line current I(BL) in the positive and negative directions change to It1 (It1<It0) and –It1 (–It1>–It0). The above hysteresis characteristics indicate the behavior of memory cell resistance Rcell in write operation. Accordingly, bit line current I(BL) in write operation, that is, data write currents +Iw, –Iw, is set within the range of It1<+Iw<It0 and –It0<–Iw<–It1.

On the other hand, bit line current I(BL) in read operation, that is, data read current Is, flows as a current for charging a data line DIO having a selected memory cell, parasitic capacitance and the like connected thereto as RC (resistance-capacitance) load. Therefore, data read current Is is commonly two or three orders smaller than bit line current I(BL) in write operation, that is, data write current ±Iw. Accordingly, in FIG. 2, data read current Is can be regarded as Is≈0.

Before read operation, the magnetization direction of free magnetic layer VL in tunneling magneto-resistance element TMR is set so that the state (a) or (c) in FIG. 2 is achieved, that is, so that the selected memory cell has either electric resistance Rmin or Rmax.

Figure 3:
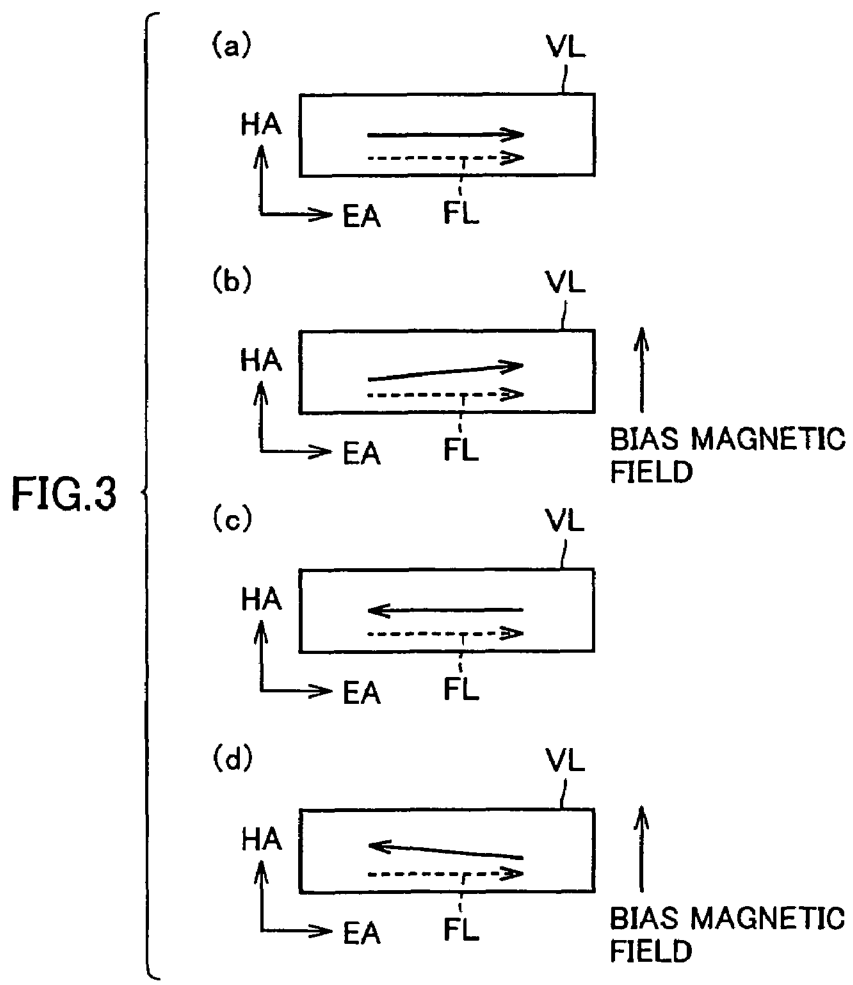
FIG. 3 is a conceptual diagram illustrating the magnetization direction of a tunneling magneto-resistance element in each state of FIG. 2.

FIG. 3 is a conceptual diagram illustrating the magnetization direction of the tunneling magneto-resistance element in each state of FIG. 2.

In FIG. 3, (a) shows the magnetization direction in the state (a) of FIG. 2. In this state, free magnetic layer VL and fixed magnetic layer FL have parallel magnetization directions. Therefore, memory cell resistance Rcell has the minimum value Rmin.

In FIG. 3, (c) shows the magnetization direction in the state (c) of FIG. 2. In this state, free magnetic layer VL and fixed magnetic layer FL have antiparallel (opposite) magnetization directions. Therefore, memory cell resistance Rcell has the maximum value Rmax.

When a prescribed current (e.g., data write current Ip) is applied to write digit line WDL in this state, the magnetization direction of free magnetic layer VL is somewhat rotated (but is not inverted). As a result, electric resistance Rcell of tunneling magneto-resistance element TMR varies.

For example, if the MTJ memory cell in the magnetized state (a) of FIG. 3 is subjected to a prescribed bias magnetic field of the hard-axis (HA) direction by digit line current I(WDL), the magnetization direction of free magnetic layer VL is somewhat rotated to form a prescribed angle with the magnetization direction of fixed magnetic layer FL, as shown in (b) of FIG. 3. Accordingly, in the magnetized state (b) of FIG. 3, memory cell resistance Rcell increases from the minimum value Rmin to the value Rm0.

Similarly, if the MTJ memory cell in the magnetized state (c) of FIG. 3 is subjected to a prescribed bias magnetic field of the hard-axis (HA) direction, the magnetization direction of free magnetic layer VL is somewhat rotated to form a prescribed angle with the magnetization direction of fixed magnetic layer FL, as shown in (d) of FIG. 3. Accordingly, in the magnetized state (d) of FIG. 3, memory cell resistance Rcell decreases from the maximum value Rmax to the value Rm1.

In this way, by applying a bias magnetic field of the hard-axis (HA) direction, memory cell resistance Rcell of an MTJ memory cell storing data corresponding to the maximum value Rmax is reduced, whereas memory cell resistance Rcell of an MTJ memory cell storing data corresponding to the minimum value Rmin is increased.

Thus, when an MTJ memory cell storing certain data is subjected to a bias magnetic field of the hard-axis (HA) direction, memory cell resistance Rcell changes in the positive or negative direction depending on the storage data. In other words, a change in memory cell resistance Rcell that occurs in response to the bias magnetic field has a different polarity depending on the storage data level. In the present embodiment, read operation is conducted by utilizing such magnetization characteristics of the MTJ memory cell.

Hereinafter, the structure of a circuit group for conducting read and write operations in memory array 10 will be described.

Figure 4:
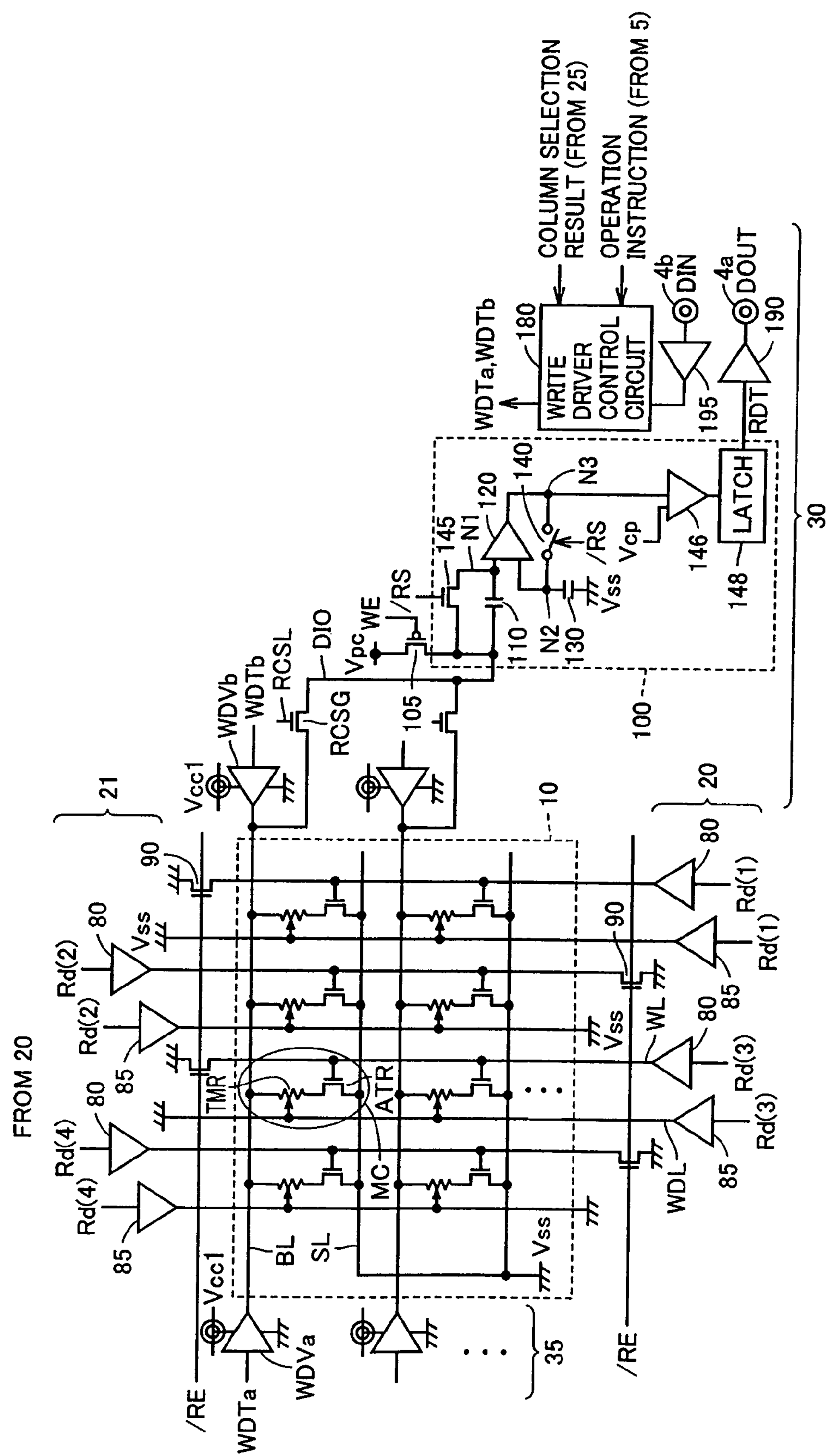
FIG. 4 is a circuit diagram showing the structure of a circuit group for conducting read operation and write operation in a memory array 10 according to a first embodiment of the present invention.

Referring to FIG. 4, memory array 10 includes MTJ memory cells MC arranged in a matrix. As described before, word lines WL and write digit lines WDL are provided corresponding to the memory cell rows, and bit lines BL and source lines SL are provided corresponding to the memory cell columns. Each MTJ memory cell MC has the same structure as that described in FIG. 11. More specifically, each MTJ memory cell MC includes a tunneling magneto-resistance element TMR and an access transistor ATR which are connected in series between a corresponding bit line BL and a corresponding source line SL.

As described before, tunneling magneto-resistance element TMR has an electric resistance according to the magnetization direction. More specifically, before read operation, tunneling magneto-resistance element TMR in each MTJ memory cell MC is magnetized along a prescribed direction in order to store either H-level ("1") or L-level ("0") data. The electric resistance of the tunneling magneto-resistance element TMR is thus set to either Rmax or Rmin.

Each source line SL is coupled to fixed voltage Vss (typically, ground voltage GND). The source voltage of each access transistor ATR is thus fixed to Vss. When a word line WL of the selected row is activated to H level, corresponding tunneling magneto-resistance elements TMR are each pulled down to fixed voltage Vss (ground voltage GND) and connected to a corresponding bit line BL.

Hereinafter, the structure of row selection circuits 20, 21 for selecting a row in memory array 10 will be described.

Row selection circuits 20, 21 include word line drivers 80 and write digit line drivers 85. Word line drivers 80 and write digit line drivers 85 are provided corresponding to the memory cell rows. Although not shown in the figure, each word line driver 80 receives power supply voltage Vcc2 and fixed voltage Vss, and each write digit line driver 85 receives power supply voltage Vcc1 and fixed voltage Vss. Note that power supply voltage Vcc1 is higher than power supply voltage Vcc2. In other words, |(Vcc1–Vss)|>|(Vcc2–Vss)|.

Word line driver 80 is provided at one end of each word line WL, and controls activation of a corresponding word line WL based on a corresponding one of row decode signals Rd(1), Rd(2), Rd(3), Rd(4) . . . . Each row decode signal indicates the decode result of a corresponding memory cell row. More specifically, when a word line WL is activated, a corresponding word line driver 80 connects the activated word line WL to power supply voltage Vcc2 (H level). When a word line WL is inactivated, a corresponding word line driver 80 connects the inactivated word line WL to fixed voltage Vss.

Write digit line driver 85 is provided at one end of each write digit line WDL, and controls activation of a corresponding write digit line WDL based on a corresponding one of row decode signals Rd(1), Rd(2), Rd(3), Rd(4) . . . . More specifically, when a write digit line WDL is activated, a corresponding write digit line driver 85 connects the activated write digit line WDL to power supply voltage Vcc1 (H level). When a write digit line WDL is inactivated, a corresponding write digit line driver 85 connects the inactivated write digit line WDL to fixed voltage Vss. Note that, hereinafter, row decode signals Rd(1), Rd(2), Rd(3), Rd (4) . . . are sometimes generally referred to as row decode signals Rd.

Row decode signal Rd is produced by a not-shown decode circuit. Row decode signal Rd is set to H level (power supply voltage Vcc2) when a corresponding memory cell row is selected. Otherwise, row decode signal Rd is set to L level (fixed voltage Vss). In at least one read operation and one write operation, row decode signal Rd of each memory cell row is held by a not-shown latch circuit.

A transistor switch 90 is provided in each memory cell row. In operation other than data read operation (that is, in operation including data write operation), each transistor switch 90 couples the other end of a corresponding word line WL to fixed voltage Vss. Each transistor switch 90 receives an inverted signal /RE of a control signal RE at its gate, and is electrically coupled between a corresponding word line WL and fixed voltage Vss. Control signal RE is activated (H level) in read operation. In the example of FIG. 4, each transistor switch 90 is formed by an N-channel MOS (Metal Oxide Semiconductor) transistor. In the specification, a MOS transistor is shown as a typical example of a field effect transistor.

The other end of each write digit line WDL is connected to fixed voltage Vss. Accordingly, when a write digit line WDL is activated in write operation, a data write current Ip is applied to the activated write digit line WDL in the direction from write digit line driver 85 toward fixed voltage Vss.

In read operation, each transistor switch 90 disconnects a corresponding word line WL from fixed voltage Vss. Word line driver 80 activates a corresponding word line WL according to a row decode signal Rd of a corresponding memory cell row. In response to this, access transistors ATR of the selected row are activated, whereby corresponding tunneling magneto-resistance elements TMR are each electrically coupled between a corresponding bit line BL and a corresponding source line SL. Row selection operation is thus conducted in memory array 10.

The same structure is provided for word line WL and write digit line WDL of each memory cell row. Note that, as shown in FIG. 4, word line drivers 80 and write digit line drivers 85 of the respective memory cell rows are arranged in a staggered manner. In other words, word line driver 80 and write digit line driver 85 are alternately arranged at one end of word line WL and write digit line WDL and at the other end thereof in every memory cell row. This enables row selection circuits 20, 21 to be efficiently arranged with a small area.

Read/write control circuit 30 includes a write driver control circuit 180. Write driver control circuit 180 operates in response to an operation instruction from control circuit 5. In operation, write driver control circuit 180 sets write control signals WDTa, WDTb of each memory cell column according to input data DIN and the column selection result from column decoder 25. Input data DIN is transmitted to write driver control circuit 180 through a data input terminal 4*b* and an input buffer 195.

Read/write control circuit 30 further includes write drivers WDVb provided in each memory cell column. Similarly, read/write control circuit 35 includes write drivers WDVa provided in each memory cell column. Each write driver WDVa drives one end of a corresponding bit line BL with either power supply voltage Vcc1 or fixed voltage Vss according to a corresponding write control signal WDTa. Similarly, each write driver WDVb drives the other end of a corresponding bit line BL with either power supply voltage Vcc1 or fixed voltage Vss according to a corresponding write control signal WDTb.

In write operation, write control signal WDTa of the selected column is set to one of H level and L level and write control signal WDTb of the selected column is set to the other level according to the level of write data DIN. For example, when H-level ("1") data is to be written, write control signal WDTa is set to H level and write control signal WDTb is set to L level in order to apply a data write current +Iw in the direction from write driver WDVa toward write driver WDVb. On the other hand, when L-level ("0") data is to be written, write control signal WDTb is set to H level and write control signal WDTa is set to L level in order to apply a data write current −Iw in the direction from write driver WDVb toward write driver WDVa. Hereinafter, data write currents +Iw, −Iw having different directions are sometimes generally referred to as data write current ±Iw. In the non-selected columns, write control signals WDTa, WDTb are set to L level.

In operation other than write operation, each write driver WDVa, WDVb disconnects a corresponding bit line BL from power supply voltage Vcc1 and fixed voltage Vss.

When data write currents Ip, ±Iw are respectively applied to a write digit line WDL and a bit line BL, data corresponding to the direction of data write current ±Iw is magnetically written to a corresponding tunneling magneto-resistance element TMR. The same structure is provided for bit line BL of each memory cell column.

Hereinafter, read operation from memory array 10 will be described.

Read/write control circuit 30 further includes a data line DIO for transmitting a voltage corresponding to the electric resistance of a selected memory cell, and read selection gates RCSG each provided between data line DIO and a corresponding bit line BL. A read column selection line RCSL is coupled to each read selection gate RCSG. Each read column selection line RCSL indicates selection/non-selection of a corresponding memory cell column. Read column selection line RCSL is activated to H level when a corresponding memory cell column is selected. The same structure is provided for each memory cell column. In other words, data line DIO is shared by bit lines BL on memory array 10.

Accordingly, in read operation, a selected memory cell is electrically coupled to data line DIO through bit line BL of the selected column and a corresponding read selection gate RCSG.

Read/write control circuit 30 further includes a data read circuit 100 and a current supply transistor 105.

Data read circuit 100 includes a coupling capacitor 110, a sense amplifier (voltage amplifier) 120, a voltage holding capacitor 130, a feedback switch 140, a transistor switch 145, a sense amplifier (voltage amplifier) 146, and a latch circuit 148.

Coupling capacitor 110 is connected between a sense input node N1 (corresponding to one of input nodes of sense amplifier 120) and data line DIO. Voltage holding capacitor 130 is connected between a sense input node N2 (corresponding the other input node of sense amplifier 120) and fixed voltage Vss in order to hold the voltage level of sense input node N2. Sense amplifier 120 amplifies the voltage difference between sense input nodes N1, N2 for output to a node N3 (corresponding to an output node of sense amplifier 120). Feedback switch 140 is provided between node N3 and sense input node N2. Transistor switch 145 is provided between data line DIO and sense input node N1. In read operation, feedback switch 140 and transistor switch 145 are turned ON before application of a bias magnetic field and turned OFF after application of the bias magnetic field in response to a control signal /RS.

Sense amplifier 146 amplifies the voltage difference between a predetermined reference voltage Vcp and node N3 for output to latch circuit 148. In read operation, latch circuit 148 latches the output of sense amplifier 146 at a prescribed timing after application of a bias magnetic field, and outputs the output of sense amplifier 146 as read data RDT. Read data RDT thus output from latch circuit 148 is output as output data DOUT from a data output terminal 4*a* through an output buffer 190. Since the voltage difference between sense input nodes N1, N2 is amplified by sense amplifiers 120, 146 of a plurality of stages, a sufficient operation margin can be assured. Moreover, sensitivity can be changed by adjusting the level of reference voltage Vcp applied to sense amplifier 146 of the second stage. Therefore, variation in sensitivity caused by manufacturing variation in element characteristics can be corrected.

Current supply transistor 105 is a P-channel MOS transistor, and receives a control signal WE, an inverted signal of a control signal /WE, at its gate. Control signal WE is activated (H level) in write operation. In other words, current supply transistor 105 is turned ON in operation other than write operation.

Accordingly, before read operation, data line DIO is coupled to a precharge voltage Vpc in response to turning-ON of current supply transistor 105. In this stage, read selection gate RCSG of each memory cell column is in the OFF state. Therefore, data line DIO is disconnected fro bit lines BL and memory cells MC. Data line DIO is thus charged to precharged voltage Vpc.

When read operation is started, word line WL of the selected row and read column selection line RCSL of the selected column are activated to H level, and data line DIO is pulled down to fixed voltage Vss (ground voltage GND) through the selected memory cell. Current supply transistor 105 remains in the ON state even after read operation is started. Therefore, a data read current Is is supplied by a precharge voltage Vpc so as to flow through the selected memory cell. As a result, a voltage corresponding to the electric resistance of the selected memory cell is produced on data line DIO.

Each read operation is formed by the first part and the latter part. In the first part of read operation, a bias magnetic field is not applied to the selected memory cell. In the latter part, a bias magnetic field is applied to the selected memory cell. In the latter part, write digit line driver 85 of the selected row operates in the same manner as that in write operation, and activates a corresponding write digit line WDL. In other words, a bias magnetic field is generated by a current supplied to write digit line WDL of the selected row. This structure eliminates the need to additionally provide a circuit for generating a bias magnetic field in read operation. Therefore, the circuit structure can be simplified.

Before a bias magnetic field is applied, that is, in the state where a current is not applied to write digit line WDL of the selected row (I(WDL)=0), data line DIO is settled to a voltage corresponding to storage data of the selected memory cell.

After a bias magnetic field is applied, that is, in the state where a bias current is applied to write digit line WDL of the selected row (I(WDL)=Ip), a prescribed magnetic field along the hard-axis direction is applied to the selected memory cell. As described before, when the selected memory cell is subjected to such a bias magnetic field, memory cell resistance Rcell of the selected memory cell varies in the positive or negative direction from the value before application of the bias magnetic field depending on the storage data level. Accordingly, the voltage on data line DIO rises or falls from the value before application of the bias magnetic field.

More specifically, when the selected memory cell stores the data corresponding to electric resistance Rmin (e.g., data “0”), the data line voltage after application of the bias magnetic field is higher than that before application of the bias magnetic field. This is because memory cell resistance Rcell is increased by the bias magnetic field produced by digit line current I(WDL), and a current flowing through tunneling magneto-resistance element TMR is reduced accordingly. On the other hand, when the selected memory cell stores the data corresponding to electric resistance Rmax (e.g., data “1”), the data line voltage after application of the bias magnetic field is lower than that before application of the bias magnetic field. This is because memory cell resistance Rcell is reduced by the bias magnetic field produced by digit line current I(WDL), and a current flowing through tunneling magneto-resistance element TMR is increased accordingly.

Hereinafter, operation of data read circuit 100 will be described in detail with reference to FIG. 5.

Figure 5:
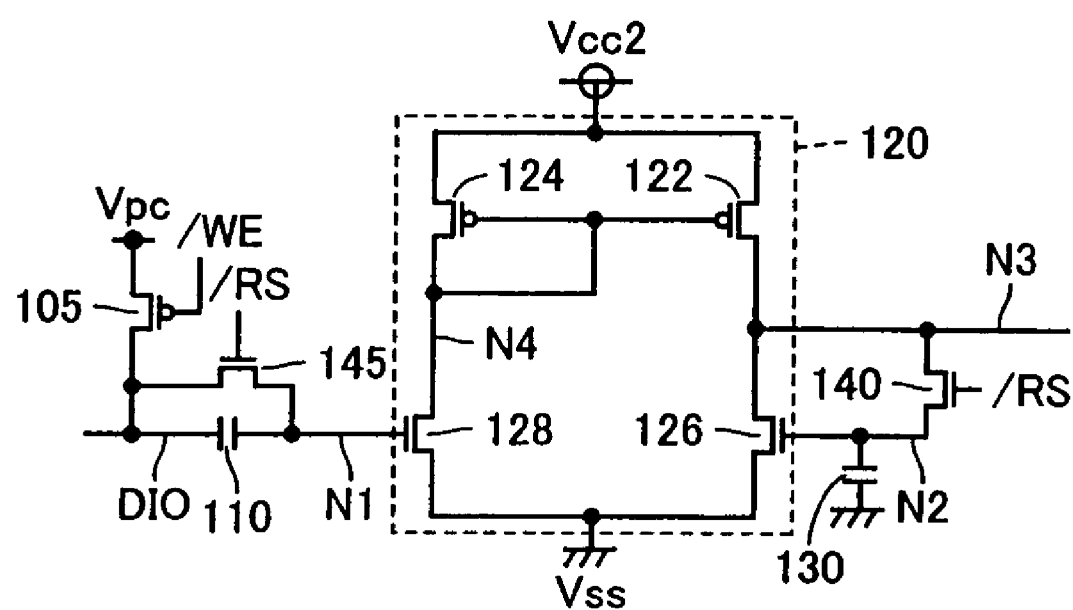
FIG. 5 is a circuit diagram showing the structure of a main part of a data read circuit in FIG. 4.

Referring to FIG. 5, sense amplifier 120 includes P-channel MOS transistors 122, 124 and N-channel MOS transistors 126, 128. P-channel MOS transistors 122, 124 are connected between power supply voltage Vcc2 and nodes N3, N4, respectively. N-channel MOS transistors 126, 128 are connected between nodes N3, N4 and fixed voltage Vss, respectively. Transistors 122, 124 have their gates connected to node N4. Transistor 126 has its gate connected to sense input node N2, and transistor 128 has its gate connected to sense input node N1. In other words, transistors 122, 124, 126, 128 together operate as a “differential amplifier” having sense input nodes N1, N2 as input nodes and node N3 as an output node.

Since coupling capacitor 110, current supply transistor 105, voltage holding capacitor 130, feedback switch 140 and transistor switch 145 are provided as described in FIG. 4, detailed description thereof will not be repeated.

Before read operation, current supply transistor 105, feedback switch 140 and transistor switch 145 are in the ON state. Therefore, data line DIO is precharged to precharge voltage Vpc. Moreover, data line DIO and sense input node N1 are short-circuited, and sense input node N2 and node N3 are short-circuited.

In this state, read operation is started, and data line DIO is pulled down to fixed voltage Vss (ground voltage GND) through the selected memory cell. Current supply transistor 105 remains in the ON state even after read operation is started. Therefore, current supply transistor 105 not only functions to precharge data line DIO before read operation and but also functions to supply a data read current to data line DIO in read operation. As a result, the voltage on data line DIO falls from precharge voltage Vpc according to a current passing through the selected memory cell, that is, the electric resistance of the selected memory cell. In read operation, the voltage on data line DIO is determined by the relation between the impedance of current supply transistor 105 and the impedance (electric resistance) of the selected memory cell.

In the first part of read operation (i.e., in the period from the start of read operation until application of a bias magnetic field), control signal /RS is inactivated to H level. Therefore, feedback switch 140 and transistor switch 145 are turned ON, and data line DIO and sense input node N1 are left short-circuited, and sense input node N2 and node N3 are also left short-circuited. As a result, in the first part of read operation, sense input nodes N1, N2 are virtually short-circuited due to negative feedback operation of sense amplifier 120. Therefore, sense input nodes N1, N2 are set to the same voltage level. This voltage of sense input node N2 is held by voltage holding capacitor 130 even after a bias magnetic field is applied.

In the strict sense, sense input nodes N1, N2 may not be set to the same voltage level due to variation in characteristics of the circuit elements of sense amplifier 120. However, in view of such variation as well, the voltage of sense input node N2 is set to a balanced state according to the voltage of sense input node N1. Therefore, an offset of the sense amplifier 120 is also adjusted by the negative feedback operation of the sense amplifier 120.

In the latter part of read operation, that is, after a bias magnetic field is applied to the selected memory cell, control signal /RS is activated to L level. As a result, data line DIO is disconnected from sense input node N1, and sense input node N2 is disconnected from node N3. The bias magnetic field applied to the selected memory cell causes the voltage on data line DIO to rise or fall from the value before application of the bias magnetic field depending on the storage data of the selected memory cell.

Such a voltage change on data line DIO is transmitted to sense input node N1 through capacitive coupling by coupling capacitor 110. Accordingly, sense amplifier 120 amplifies the difference between the voltage of sense input node N2 (which is held by voltage holding capacitor 130) which has reached the balanced state before application of the bias magnetic field and the voltage of sense input node N1 after application of the bias magnetic field, and outputs the resultant voltage to node N3. In other words, the voltage of node N3 varies depending on the storage data of the selected memory cell.

Figure 6:
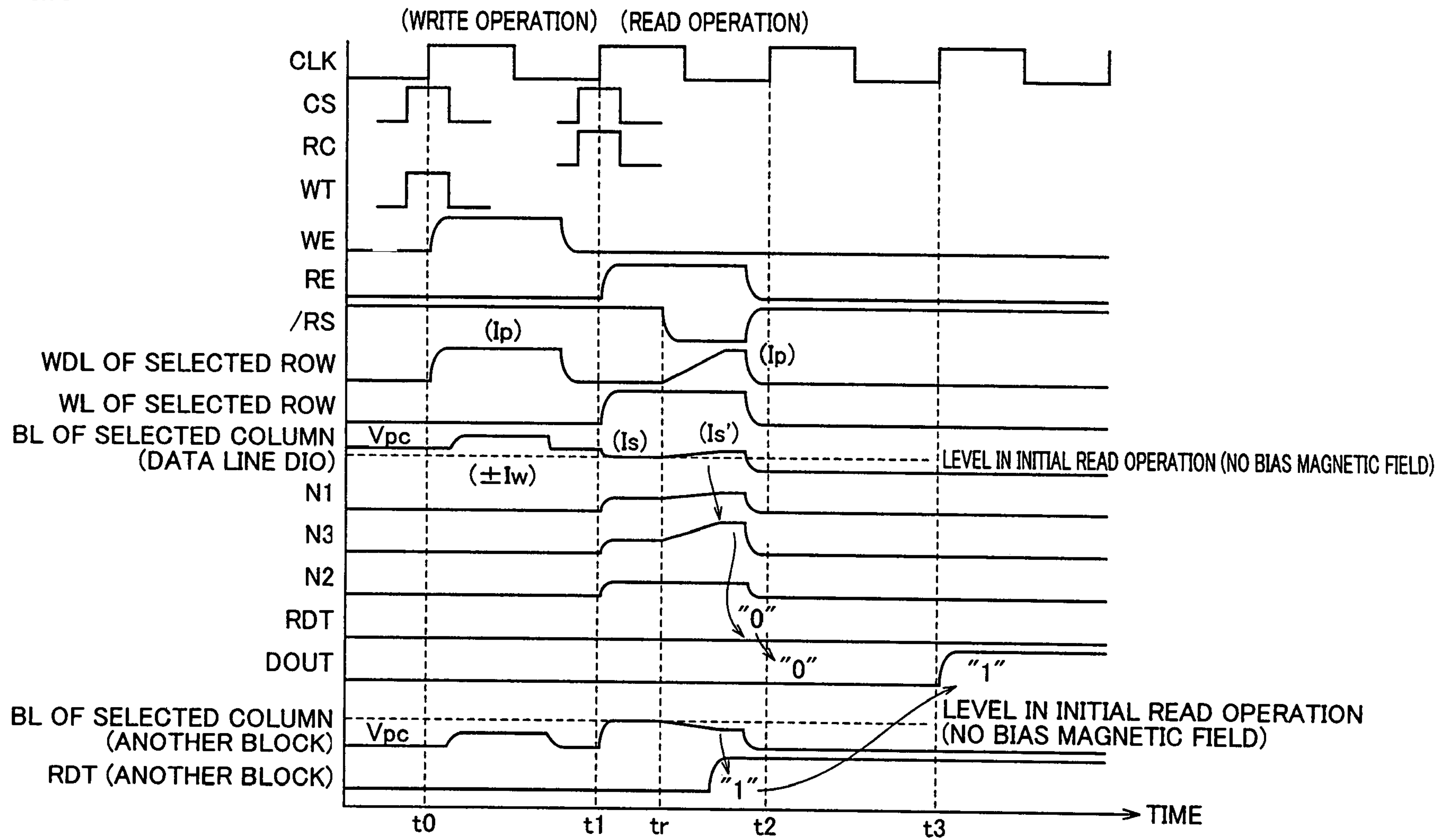
FIG. 6 is a waveform chart illustrating read operation according to an embodiment of the present invention.

FIG. 6 is a waveform chart illustrating read operation according to an embodiment of the present invention.

Referring to FIG. 6, each read operation according to an embodiment of the present invention can be conducted in synchronization with, e.g., a clock signal CLK.

More specifically, at time t1 (i.e., at a rising edge of clock signal CLK), read operation is started in response to a chip select signal CS and a read command RC. Word line WL of the selected row is activated, and a data read current Is is supplied to bit line BL of the selected column. In the first part of the read operation (from time t1 to time tr; a period during which control signal /RS is at H level), a bias magnetic field is not applied, and the voltage on bit line BL of the selected column, that is, the voltage on data line DIO, reaches the level corresponding to the electric resistance (storage data) of the selected memory cell. This data line voltage is transmitted to sense input nodes N1, N2, and the voltage thus transmitted to sense input node N2 is held by voltage holding capacitor 130.

In the latter part of the read operation. (after time tr; a period during which control signal /RS is at L level), word line WL of the selected row and control signal RS are retained active (H level), and a bias current equivalent to data write current Ip is gradually supplied to write digit line WDL of the selected row. In other words, a bias magnetic field is gradually applied to the selected memory cell. In response to this, the voltage on bit line BL of the selected column (data line DIO) varies in the positive or negative direction (rises or falls) depending on the storage data of the selected memory cell. Note that the structure for supplying a bias current for generating a bias magnetic field will be described in detail in the second embodiment.

The change in data line voltage caused by the bias magnetic field is transmitted to sense input node N1 through coupling capacitor 110. Therefore, a positive or negative voltage difference is produced between sense input nodes N1, N2 depending on the storage data of the selected memory cell. Read data RDT is produced by amplifying this voltage difference by sense amplifiers 120, 146 and latch circuit 148.

From time t2 (corresponding to the following rising edge of clock signal CLK), output data DOUT corresponding to read data RDT is output from data output terminal 4*a*. The magnetization direction of tunneling magneto-resistance element TMR is not inverted by the bias magnetic field applied to the selected memory cell by the bias current (data write current Ip) flowing through write digit line WDL. Accordingly, as soon as the bias magnetic field is eliminated, the magnetization direction of the selected memory cell is restored to the same state as before read operation. Storage data of the selected memory cell is not destroyed in the read operation according to an embodiment of the present invention. Therefore, rewrite operation as in the conventional self-reference read operation is not required.

It should be noted that the MRAM device may have a plurality of blocks each having the structure of FIG. 4 for writing and reading 1-bit data. FIG. 6 also shows the read operation in such a MRAM device.

In the MRAM device having a plurality of blocks, the same read operation is conducted in each block in parallel. In each block, read data RDT from the selected memory cell is produced at time t2. In this case, read data RDT from each of the plurality of blocks can be output as output data DOUT in a burst manner at every rising edge of dock signal CLK from time t2. In the example of FIG. 6, read data RDT from one block is output as output data DOUT ("0") at time t2, and read data RDT from another block is output as output data DOUT ("1") at time t3 (the following rising edge of dock signal CLK.

According to the first embodiment, self-reference read operation can be conducted by merely accessing a selected memory cell without using any reference cell. In other words, read data is produced based on the voltage comparison conducted by the same data read path including the same memory cell, the same bit line, the same data line, the same sense amplifier and the like. Since no reference cell is required, data can be stored in each MTJ memory cell, and every MTJ memory cell can be used as a valid bit.

The self-reference read operation enables improvement in accuracy of read operation without being subjected to the influences such as an offset caused by manufacturing variation of the circuits included in the data read path. In other words, read operation can be conducted with higher accuracy regardless of the influences of manufacturing variation and the like, as compared to the case where read operation from a selected memory cell is conducted based on the comparison with another memory cell (such as a reference cell) and read operation circuitry corresponding thereto.

Unlike the conventional self-reference read operation, forcible write and read operations and rewrite operation after destroy of storage data of the selected memory cell are not required in each read operation of the first embodiment. This enables implementation of high-speed self-reference read operation.

Especially, in the read operation of the first embodiment, application of a bias magnetic field is started with word line WL being retained in an active state, and a continuous voltage change on data line DIO caused by the bias magnetic field is obtained at a predetermined timing. This enables further improvement in read operation speed.

Moreover, an offset of sense amplifier 120 can be adjusted by negative feedback operation of sense amplifier 120 before application of a bias magnetic field. This enables further improvement in accuracy of read operation.

Moreover, a current flowing through write digit line WDL which is used in write operation is used as a bias current for generating a bias magnetic field. This eliminates the need to additionally provide a circuit for supplying a bias current in read operation. As a result, the circuit structure can be simplified.

Modification of First Embodiment

In the modification of the first embodiment, another example of the structure of the data read circuit will be described.

Figure 7:
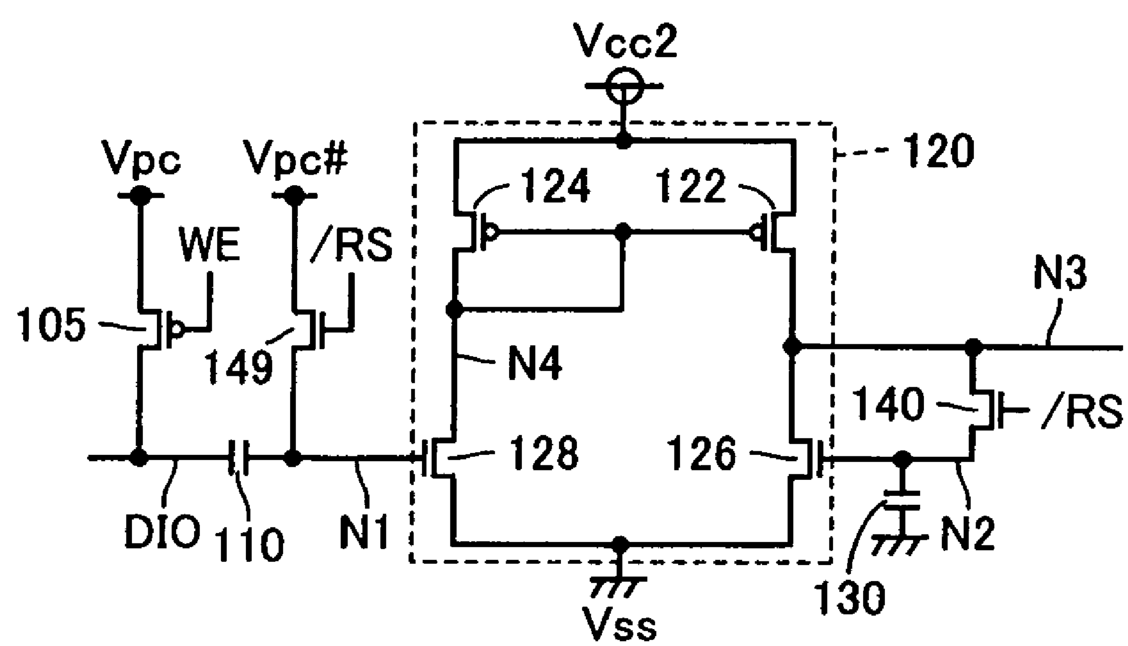
FIG. 7 is a circuit diagram showing the structure of a main part of a data read circuit according to a modification of the first embodiment.

Referring to FIG. 7, the data read circuit according to the modification of the first embodiment is different from the first embodiment in FIG. 5 in that transistor switch 145 is replaced with a precharge transistor 149. Since the structure of the data read circuit excluding the peripheral circuitry of sense amplifier 120 shown in FIG. 7 and the structure of other circuits are the same as those of the first embodiment, detailed description thereof will not be repeated.

Precharge transistor 149 is an N-channel MOS transistor, and is connected between a precharge voltage Vpc# and sense input node N1. Like feedback switch 140, precharge transistor 149 is turned ON/OFF in response to a control signal /RS.

In this structure, sense input node N1 is precharged to precharge voltage Vpc# before read operation and before application of a bias magnetic field during read operation. As a result, sense input node N2 is set to the same level as that of precharge voltage Vpc#.

Like the first embodiment, data line DIO is precharged to precharged voltage Vpc by current supply transistor 105 before read operation. In read operation, data line DIO is changed to the voltage level corresponding to the electric resistance (storage data) of a selected memory cell.

In this state, feedback switch 140 and precharge transistor 149 are turned OFF after application of a bias magnetic field, and the bias magnetic field is applied in the same manner as that in the first embodiment. In response to the bias magnetic field, the voltage on data line DIO changes from the value before application of the bias magnetic field, and the voltage of sense input node N1 changes from precharge voltage Vpc# according to the voltage change on data line DIO. On the other hand, sense input node N2 is held at precharge voltage Vpc#. Therefore, the voltage of node N3, that is, the output node of sense amplifier 120, changes in the same manner as that in the first embodiment. As a result, read operation is conducted in the same manner as that in the first embodiment.

In the modification of the first embodiment, precharge voltage Vpc of data line DIO and precharge voltage Vpc# of sense input nodes N1, N2 in the balanced state before application of a bias magnetic field can be independently set to optimal values.

For example, in view of MR (Magneto-Resistive) characteristics in the MTJ memory cell, precharge voltage Vpc of data line DIO is set to such a level that a junction resistance difference ΔR (Rmax−Rmin) is likely to appear. On the other hand, precharge voltage Vpc# of sense input nodes N1, N2 is separately set to a level that is suitable for assuring an operation margin of sense amplifier 120. This is implemented by insulating data line DIO from sense input node N1 of sense amplifier 120 by coupling capacitor 110. Accordingly, the precharge voltages of data line DIO and sense input node N1 can be selected arbitrarily.

The above structure enables further improvement in read operation margin over the first embodiment.

Second Embodiment

In the second embodiment, the structure for supplying a current to write digit line WDL will be described. This structure is used for both a data write current (write operation) and a bias current (read operation).

Figure 8:
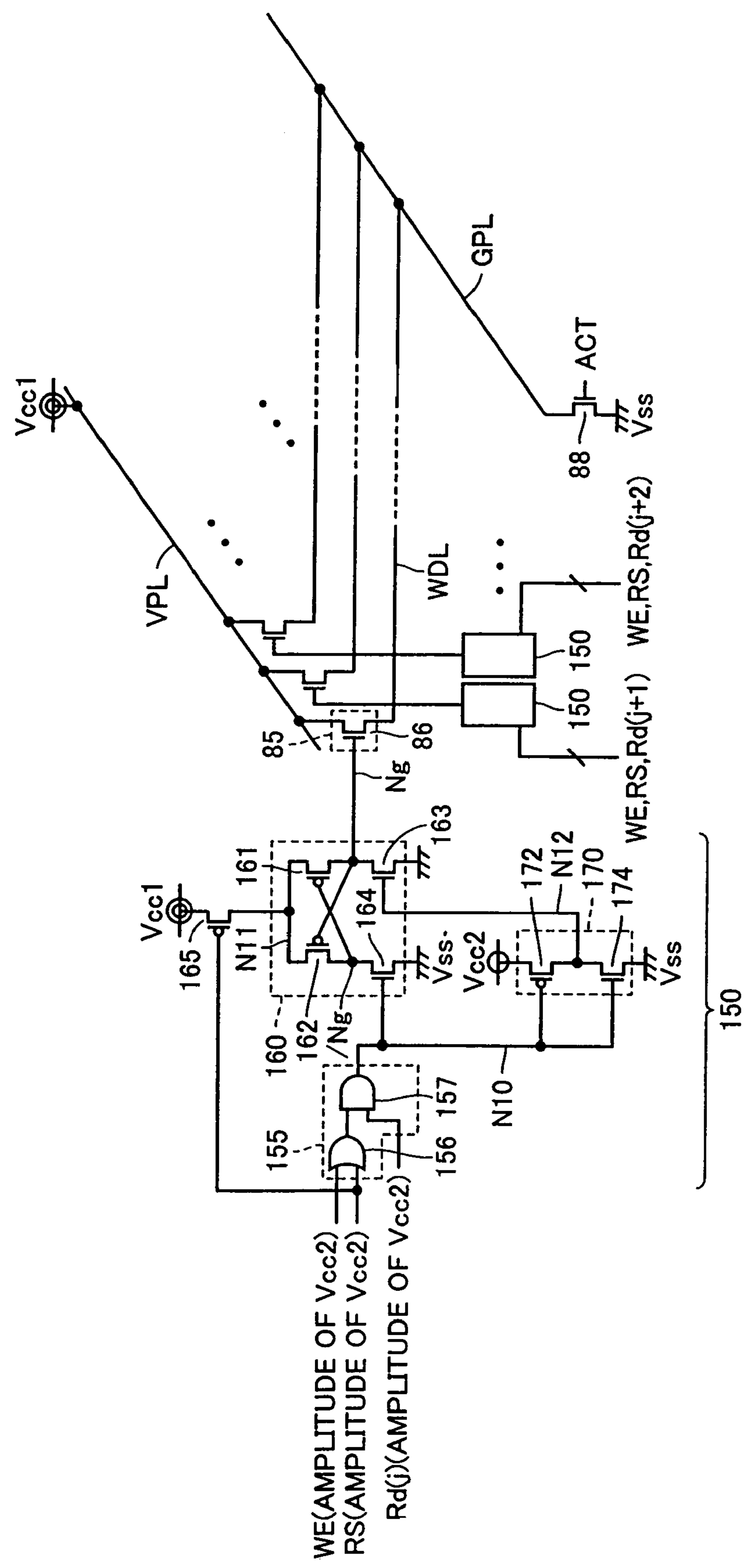
FIG. 8 is a circuit diagram showing the structure of a circuit group for controlling current supply to a write digit line WDL according to a second embodiment of the present invention.

FIG. 8 is a circuit diagram showing the structure of a circuit group for controlling current supply to write digit line WDL according to the second embodiment.

Referring to FIG. 8, a write digit line driver 85 is provided for each write digit line WDL. Each write digit line driver 85 has a driver transistor 86. Driver transistor 86 is a N-channel MOS transistor, and is connected in series with a corresponding write digit line VDL between a power supply voltage line VPL for transmitting power supply voltage Vcc1 and a ground voltage line GPL. Ground voltage line GPL is connected to fixed voltage Vss through a transistor switch 88. Transistor switch 88 is turned ON/OFF in response to a control signal ACT. Control signal ACT is activated to H level during the active period of the MRAM device excluding a standby mode and a power saving mode. During the inactive period of control signal ACT, ground voltage line GPL is rendered in a floating state, and raises the source voltage of the N-channel MOS transistors so that the N-channel MOS transistors have a negative gate-source voltage. A leak current of the N-channel MOS transistors can thus be reduced.

Moreover, a write digit line drive control section 150 is provided for each write digit line driver 85 (driver transistor 86), that is, in each memory cell row.

In read and write operations, each write digit line drive control section 150 turns ON a corresponding driver transistor 86 based on the row selection result of a corresponding memory cell row. When a driver transistor 86 is turned ON, a current is supplied to a corresponding write digit line WDL in the direction from power supply voltage line VPL toward ground voltage line GPL. In order to supply a sufficient data write current in write operation, the activated write digit line WDL is thus driven by power supply voltage Vcc1 which is higher than power supply voltage Vcc2 of other peripheral circuits including read operation circuitry.

Each write digit line drive control section 150 includes a logic circuit 155, a level converter 160, a current supply transistor 165, and an inverter 170. FIG. 8 exemplarily shows the structure of a write digit line drive control section 150 of the $j^{th}$ row (where j is a natural number).

Logic circuit 155 includes logic gates 156, 157. Logic gate 156 outputs the OR operation result of control signals WE, RS. Logic gate 157 outputs the AND operation result of a row decode signal Rd(j) and an output signal of logic gate 156 to a node N10. Like the signals of the read operation circuitry (such as sense amplifier 120), control signals WE, RS each has an amplitude from fixed voltage Vss (L level) to power supply voltage Vcc2 (H level). In other words, row decode signal Rd(j) is activated to H level (power supply voltage Vcc2) when a corresponding memory cell row is selected.

In write operation (control signal WE is at H level) and when a bias voltage is applied in read operation (control signal RS is at H level), logic circuit 155 sets the voltage of node N10 to H level (power supply voltage Vcc2) in response to selection of a corresponding memory cell. Otherwise, logic circuit 155 sets the voltage of node N10 to L level (fixed voltage Vss).

Inverter 170 includes a P-channel MOS transistor 172 and an N-channel MOS transistor 174. P-channel MOS transistor 172 and N-channel MOS transistor 174 are connected between power supply voltage Vcc2 and fixed voltage Vss so as to form a CMOS (Complementary Metal Oxide Semiconductor) inverter. Transistors 172, 174 have their gates connected to node N10, and the connection gate of transistors 172, 174 is connected to a node N12.

Level converter 160 includes P-channel MOS transistors 161, 162 and N-channel MOS transistors 163, 164. P-channel MOS transistors 161, 162 are connected between a node N11 and nodes Ng, /Ng, respectively. N-channel MOS transistors 163, 164 are connected between nodes Ng, /Ng and fixed voltage Vss, respectively. Transistor 161 has its gate connected to node /Ng, and transistor 162 has its gate connected to node Ng. Transistor 163 has its gate connected to node N12 which corresponds to an output node of inverter 170, and transistor 164 has its gate connected to node N10.

Level converter 160 sets output node Ng to H level (power supply voltage Vcc1) when node N10 is set to H level (power supply voltage Vcc2). On the other hand, level converter 160 sets output node Ng to L level (fixed voltage Vss) when node N10 is set to L level (fixed voltage Vss). Node Ng is connected to the gate of a corresponding driver transistor 86. The voltage of node /Ng is set to an inverted level of the voltage of node Ng.

Level converter 160 thus increases the amplitude of the output signal of logic circuit 155 which is based on the row selection result of a corresponding memory cell row, and transmits the resultant signal to the gate of a corresponding driver transistor 86.

Current supply transistor 165 is a P-channel MOS transistor. Current supply transistor 165 is connected between power supply voltage Vcc1 and node N11, and receives control signal RS at its gate. Accordingly, current supply transistor 165 controls an operating current of level converter 160 according to the level of control signal RS.

More specifically, during the L-level period of control signal RS, current supply transistor 165 is turned ON to supply a full amount of operating current. Therefore, level converter 160 can operate at a high speed. On the other hand, during the H-level period of control signal RS, the gate voltage of current supply transistor 165 is set to voltage Vcc2 having an intermediate level of power supply voltage Vcc1 and fixed voltage Vss. Therefore, a current passing through current supply transistor 165 is reduced. As a result, an operating current of level converter 165 is reduced, whereby the operation speed of level converter 165 is reduced.

Accordingly, in write operation, level converter 160 receiving a full amount of operating current quickly changes the gate voltage of drive transistor 86 of the selected row to H level (power supply voltage Vcc1). As a result, write digit line WDL is coupled to power supply voltage Vcc1, whereby supply of a data write current is started quickly.

On the other hand, when a bias magnetic field is applied in read operation, a reduced amount of operating current is applied to level converter 160. Therefore, the gate voltage of driver transistor 86 of the selected row gradually changes to H level (power supply voltage Vcc1). As a result, a bias current supplied to write digit line WDL rises more slowly as compared to the data write current in write operation.

Since a bias magnetic field applied to the selected memory cell also changes gradually, abrupt change in voltage on data line DIO is prevented, whereby stable read operation with reduced noises can be implemented.

Moreover, since transistor switch 88 is provided for ground voltage line GPL, non-selected write digit lines WDL can be rendered in a floating state. As a result, the source voltage (voltage on write digit line WDL) is higher than the gate voltage (fixed voltage Vss) in driver transistors 86 (N-channel MOS transistors) corresponding to the non-selected write digit lines WDL. Since a negative bias is applied between the gate and source of these driver transistors 86, a leakage current of driver transistors 86 can be reduced.

As a result, even if the threshold voltage of driver transistor 86 is set to a low value in order to improve its current driving capability in the ON state, a leak current can be prevented from being generated while driver transistor 86 is OFF.

First Modification of Second Embodiment

Figure 9:
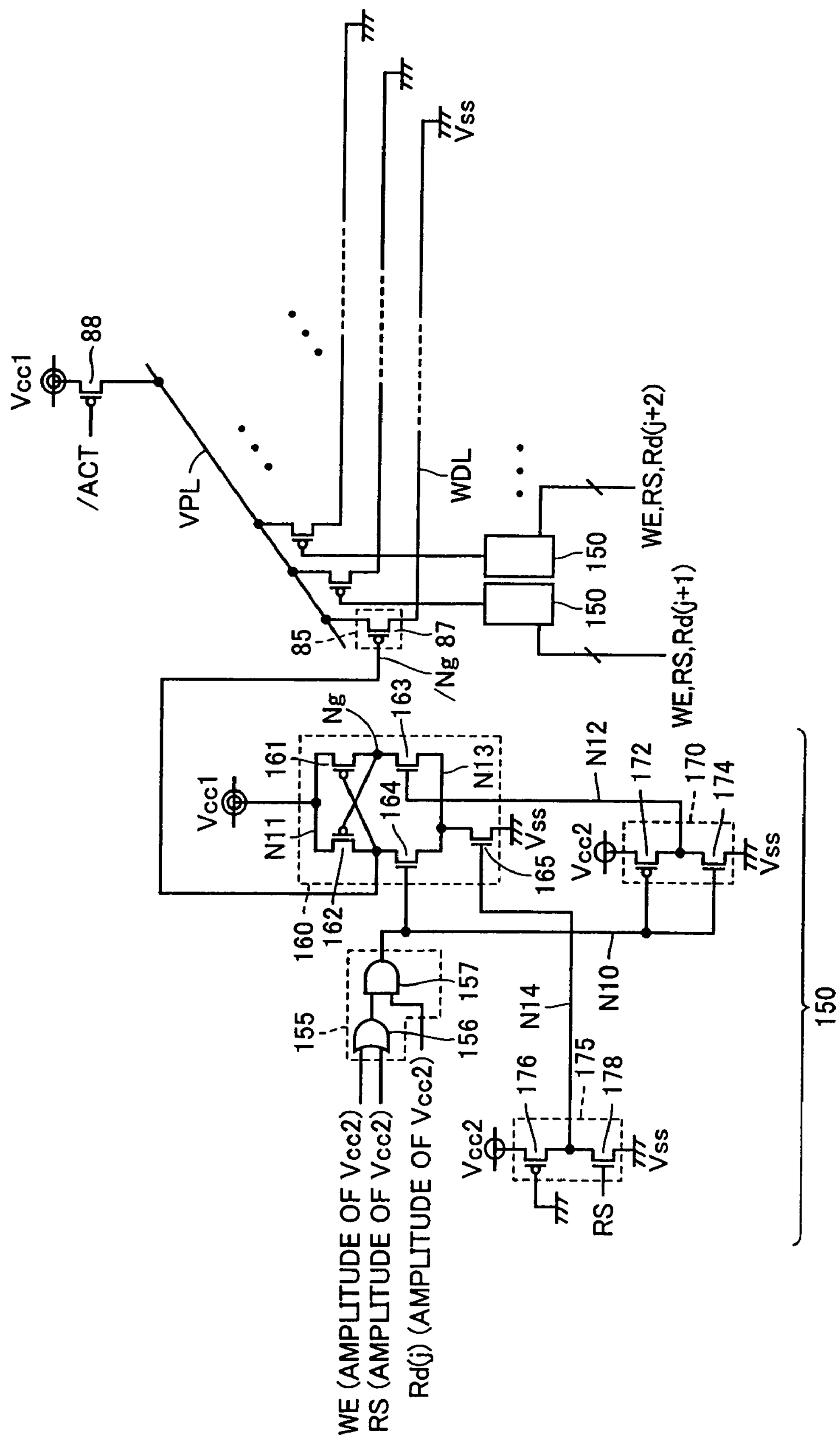
FIG. 9 is a circuit diagram showing the structure of a circuit group for controlling current supply to a write digit line WDL according to a first modification of the second embodiment.

FIG. 9 is a circuit diagram showing the structure of a circuit group for controlling current supply to write digit line WDL according to the first modification of the second embodiment.

Referring to FIG. 9, the structure of the first modification of the second embodiment is different from the second embodiment in FIG. 8 in that each write digit line driver 85 is formed by a driver transistor 87 which is a P-channel MOS transistor. Driver transistor 87 has its gate connected to node /Ng instead of node Ng.

Accordingly, unlike the structure of FIG. 8, a P-channel MOS transistor is used as transistor switch 88, and transistor switch 88 is connected between power supply voltage Vcc1 and power supply voltage line VPL. Transistor switch 88 receives a signal /ACT, an inverted signal of control signal ACT, at its gate.

In each write digit line drive control section 150, an N-channel MOS transistor is used as current supply transistor 165, and current supply transistor 165 is provided between a node N13 and fixed voltage Vss instead of between power supply voltage Vcc1 and node N1. Each write digit line drive control section 150 further includes a current limitation control circuit 175 for controlling the gate voltage of a corresponding current supply transistor 165.

Current limitation control circuit 175 includes a P-channel MOS transistor 176 and an N-channel MOS transistor 178. P-channel MOS transistor 176 is connected between power supply voltage Vcc2 and a node N14. N-channel MOS transistor 178 is connected between node N14 and fixed voltage Vss. Node N14 is connected to the gate of current supply transistor (N-channel MOS transistor) 165. Transistor 176 has its gate connected to fixed voltage Vss. Therefore, transistor 176 is always in the ON state. On the other hand, control signal RS is applied to the gate of transistor 178.

Current limitation control circuit 175 controls the voltage level of node N14 in response to control signal RS. More specifically, during the H-level period of control signal RS, that is, during the application period of a bias magnetic field in read operation, the voltage of node N14 is set to an intermediate level of power supply voltage Vcc2 and fixed voltage Vss. As a result, a current flowing through current supply transistor 164 is limited, whereby the operation speed of level converter 160 is reduced. In other words, the voltages of nodes Ng, /Ng are changed slowly by level converter 160.

On the other hand, during the L-level period of control signal RS, node N14 is set to power supply voltage Vcc2 by transistor 176. As a result, a current flowing through current supply transistor 165 is increased, and the voltages of nodes Ng, /Ng are changed rapidly by level converter 160.

Note that, since the structure and operation of write digit line drive control section 150 are otherwise the same as those described in FIG. 8, detailed description thereof will not be repeated. Accordingly, the same effects as those of the second embodiment can be obtained even if a P-channel MOS transistor is used as a driver switch of write digit line WDL.

Second Modification of Second Embodiment

Figure 10:
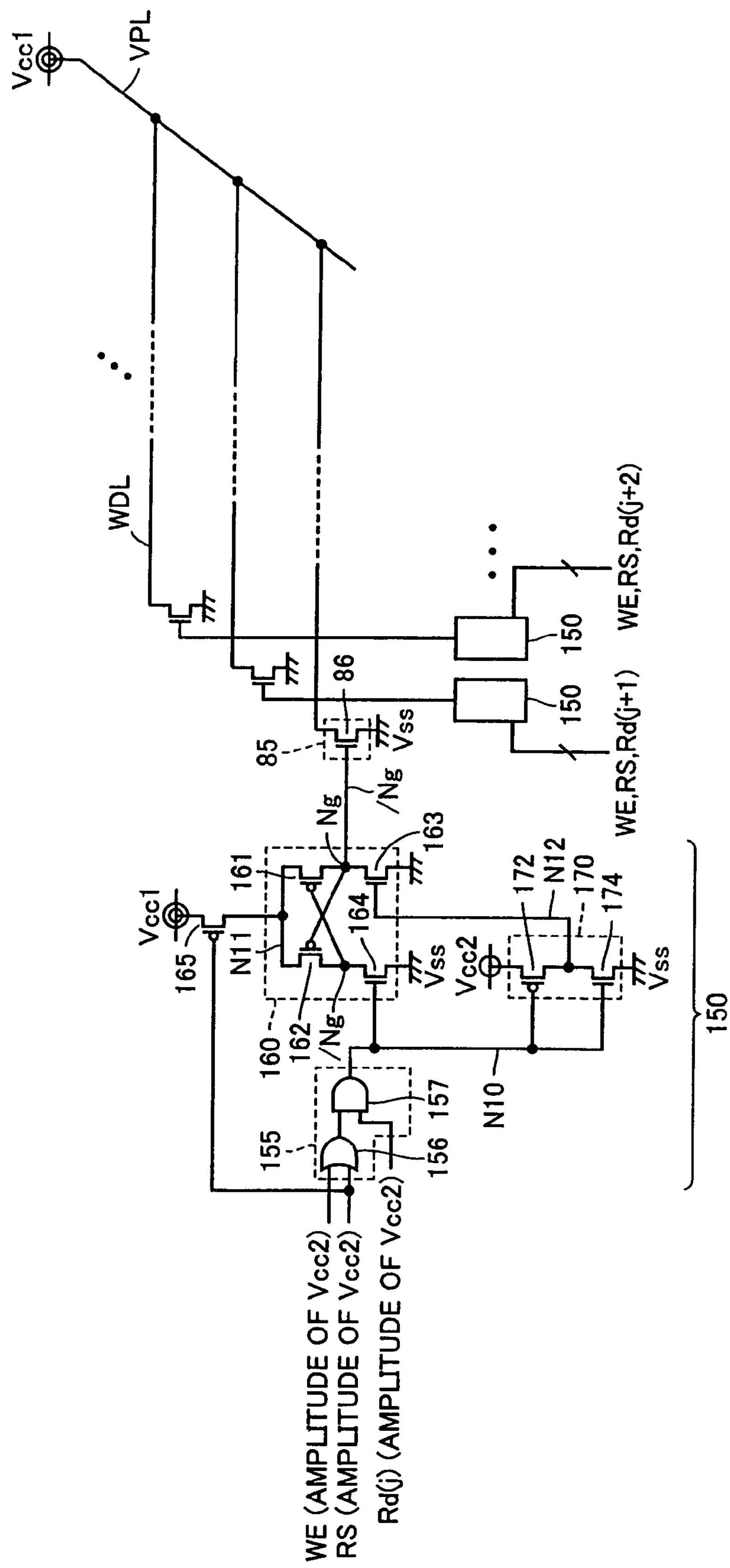
FIG. 10 is a circuit diagram showing the structure of a circuit group for controlling current supply to a write digit line WDL according to a second modification of the second embodiment.
Figure 11:
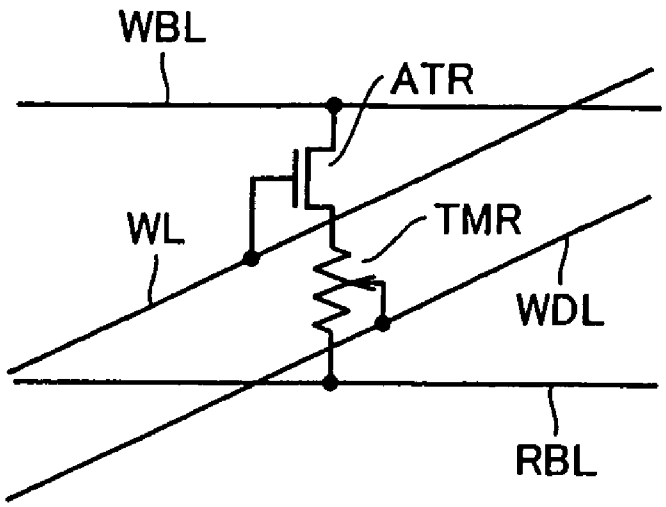
FIG. 11 schematically shows the structure of an MTJ memory cell.
Figure 12:
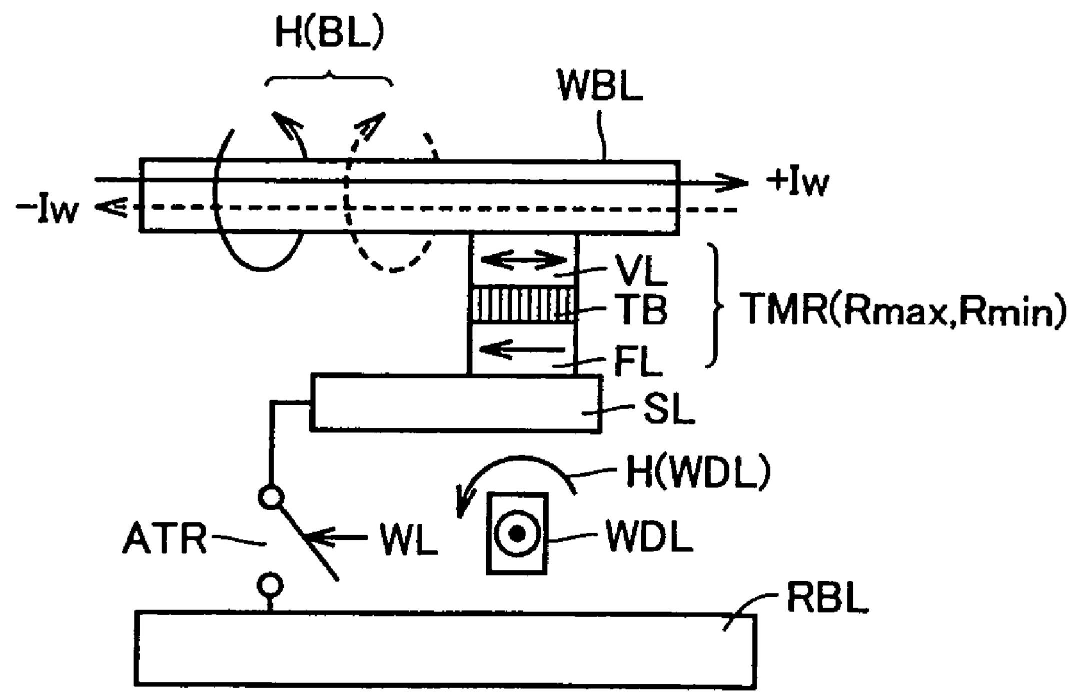
FIG. 12 is a conceptual diagram illustrating write operation to an MTJ memory cell.
Figure 13:
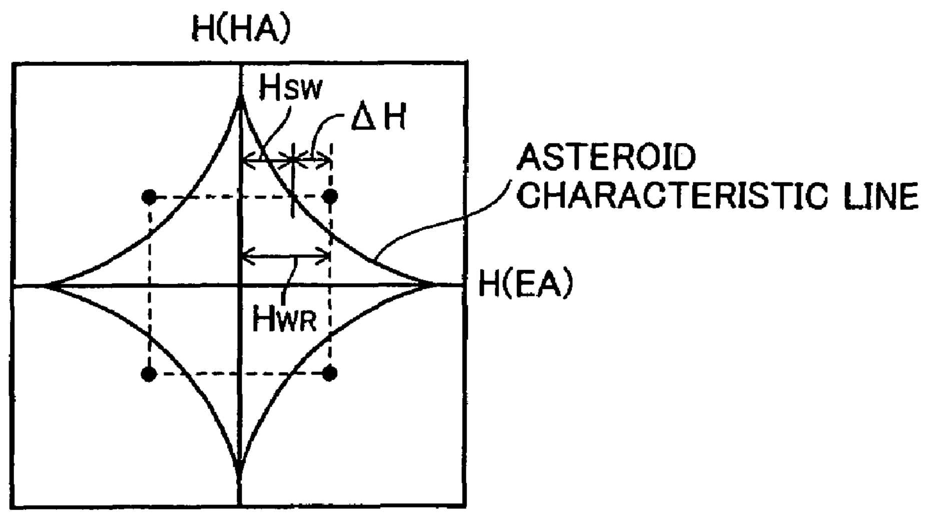
FIG. 13 is a conceptual diagram showing the relation between a data write current and the magnetization direction of a tunneling magneto-resistance element in write operation.
Figure 14:
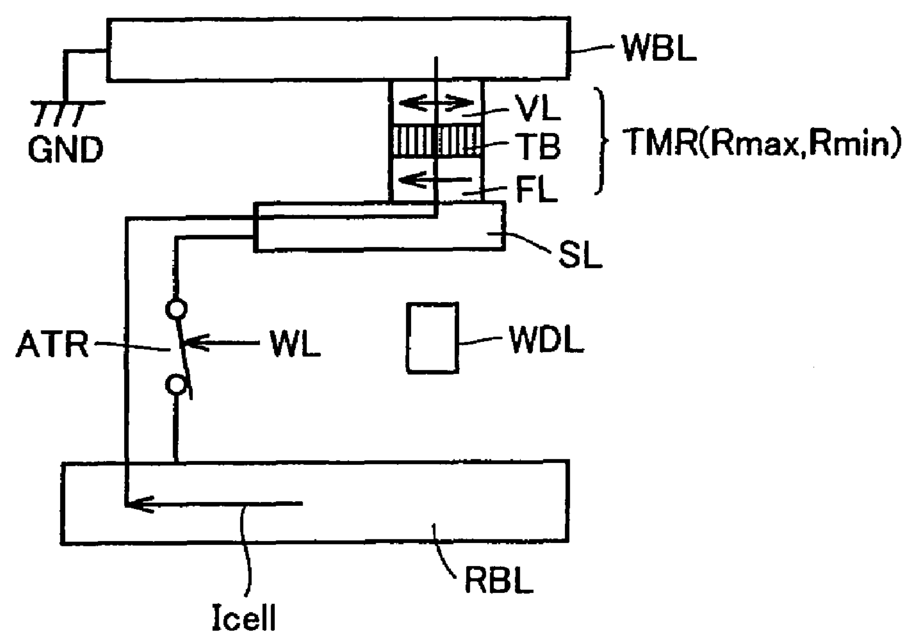
FIG. 14 is a conceptual diagram illustrating read operation from an MTJ memory cell.

FIG. 10 is a circuit diagram showing the structure of a circuit group for controlling current supply to write digit line WDL according to the second modification of the second embodiment.

Referring to FIG. 10, the structure of the second modification of the second embodiment is different from the second embodiment in FIG. 8 in that each driver transistor 86 (N-channel MOS transistor) is connected between a corresponding write digit line WDL and fixed voltage Vss, and in that transistor switch 88 for rendering write digit line WDL in a floating state during a standby period is eliminated.

Since the structure and operation of other portions write digit line drive control section 150 are the same as those described in FIG. 8, detailed description thereof will not be repeated. The same effects as those of the second embodiment can be obtained in this structure.

Note that, provided that a P-channel MOS transistor and an N-channel MOS transistor has the same transistor size, the N-channel MOS transistor has greater current driving capability than the P-channel MOS transistor. Therefore, the use of an N-channel MOS transistor as a driver transistor and provision of transistor switch 88 enables reduction in size of write digit line driver 85 especially in the structure of FIG. 8.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:

a plurality of memory cells each being magnetized along an easy axis in a direction corresponding to storage data magnetically written therein, and each having an electric resistance corresponding to a magnetization direction;

a data line that is electrically coupled to a fixed voltage through a selected one of said plurality of memory cells in read operation;

a current supply circuit for coupling said data line to a prescribed voltage at least in said read operation; and a bias magnetic field applying section for applying a bias magnetic field along a hard axis to the selected memory cell in said read operation and applying a data write magnetic field along said hard axis to a selected memory cell in said write operation, said bias magnetic field applying section includes a plurality of current lines each provided for every prescribed block of said plurality of memory cells, and each selectively receiving a current for applying the magnetic field of a direction along said hard axis to each of corresponding memory cells, a plurality of driver transistors provided corresponding to said plurality of current lines and each connected in series with corresponding one of said plurality of current lines between first and second voltages, and a plurality of current line drive control sections provided corresponding to said plurality of current return lines and each for controlling ON/OFF of corresponding one of said plurality of driver transistors, said current line drive control section includes a control circuit for controlling a driver current of said driver transistor according to address information indicating whether the corresponding current line corresponds to said selected memory cell or not, wherein said control circuit causes said driver current to change more slowly in said read operation than in said write operation, said thin film magnetic memory device further comprising:

a data read circuit for producing read data corresponding to storage data of the selected memory cell, based on voltages on said data line before and after application of said bias magnetic field to the selected memory cell in said read operation.

2. The thin film magnetic memory device according to claim 1, further comprising:

a transistor switch for electrically disconnecting each of said plurality of current lines from both said first and second voltages in a non-operating period of said thin film magnetic memory device.

3. The thin film magnetic memory device according to claim 1, wherein each driver transistor is an N-channel field effect transistor.

* * * * *